United States Patent
Godbole et al.

(10) Patent No.: US 8,985,850 B1
(45) Date of Patent: Mar. 24, 2015

(54) ADAPTIVE GATE DRIVER STRENGTH CONTROL

(75) Inventors: Kedar Godbole, San Jose, CA (US); Hariom Rai, Milpitas, CA (US); Anita Meng, Los Altos, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 335 days.

(21) Appl. No.: 12/896,520

(22) Filed: Oct. 1, 2010

Related U.S. Application Data

(60) Provisional application No. 61/256,306, filed on Oct. 30, 2009.

(51) Int. Cl.
*G01K 7/01* (2006.01)
*H03K 17/00* (2006.01)

(52) U.S. Cl.
CPC .................................. *G01K 7/01* (2013.01)
USPC ............ 374/178; 327/513; 702/130; 374/183

(58) Field of Classification Search
CPC ... G01K 7/01; G01K 15/005; G01K 2217/00; G01K 7/00; H01L 2924/13091
USPC ............. 374/1, 163, 170–173, 178, 183, 100, 374/141; 327/513, 512, 378, 389; 307/140, 307/151, 107, 108; 702/99, 130, 132
See application file for complete search history.

(56) References Cited

U.S. PATENT DOCUMENTS

| | | | | |
|---|---|---|---|---|
| 4,015,216 A * | 3/1977 | Masuda | ............................. | 331/8 |
| 4,890,009 A * | 12/1989 | Miyazaki et al. | ............. | 327/108 |
| 5,063,307 A * | 11/1991 | Zommer | ........................ | 327/512 |
| 5,304,837 A * | 4/1994 | Hierold | .......................... | 257/470 |
| 5,444,406 A * | 8/1995 | Horne | ........................... | 327/277 |
| 5,594,697 A * | 1/1997 | Hirano et al. | ............. | 365/185.21 |
| 5,650,737 A * | 7/1997 | Eilley | ............................. | 327/108 |
| 5,703,575 A * | 12/1997 | Kirkpatrick | .............. | 340/870.17 |
| 6,262,906 B1 * | 7/2001 | Salzmann et al. | ............ | 363/141 |
| 6,373,296 B1 * | 4/2002 | Auer et al. | ..................... | 327/108 |
| 6,456,124 B1 * | 9/2002 | Lee et al. | ....................... | 327/108 |
| 6,496,049 B2 * | 12/2002 | Tsukagoshi et al. | .......... | 327/322 |
| 6,946,896 B2 * | 9/2005 | Behzad | ........................... | 327/512 |
| 6,948,847 B2 * | 9/2005 | Pihet et al. | ..................... | 374/178 |
| 6,992,520 B1 | 1/2006 | Herbert | | |
| 7,129,740 B2 * | 10/2006 | Pentakota et al. | .............. | 326/31 |
| 7,183,834 B2 | 2/2007 | Nadd et al. | | |
| 7,285,876 B1 | 10/2007 | Jacobson | | |
| 7,493,506 B2 | 2/2009 | Balasubramanian et al. | | |
| 7,507,023 B2 * | 3/2009 | Oyabe et al. | ................... | 374/178 |
| 7,548,825 B2 * | 6/2009 | Bayerer et al. | .................. | 702/99 |
| 7,586,765 B2 | 9/2009 | McGarry et al. | | |
| 7,607,828 B2 * | 10/2009 | Beier et al. | ..................... | 374/163 |
| 7,672,106 B1 * | 3/2010 | Sullivan | ....................... | 361/93.8 |

(Continued)

OTHER PUBLICATIONS

Welchko et al., "A Three-Level MOSFET Inverter for Low Power Drives," IEEE Transactions on Industrial Electronics, vol. 51, No. 3, Jun. 2004, pp. 669-674; 6 pages.

*Primary Examiner* — Gail Kaplan Verbitsky

(57) ABSTRACT

An adaptive algorithm running on a processing device receives a temperature value that represents a temperature at a gate terminal of a transistor. The adaptive algorithm, determines a drive strength value that represents a drive strength for a signal based on the temperature value. A signal with the determined drive strength is applied to the gate terminal of the transistor.

20 Claims, 5 Drawing Sheets

(56) References Cited

U.S. PATENT DOCUMENTS

| | | | |
|---|---|---|---|
| 7,741,881 B2 | 6/2010 | Wickersham et al. | |
| 7,782,035 B2 | 8/2010 | Cheung et al. | |
| 7,808,222 B2 | 10/2010 | Ueunten | |
| 7,812,647 B2 | 10/2010 | Williams | |
| 7,853,812 B2* | 12/2010 | McBrearty et al. | 713/320 |
| 7,859,315 B2* | 12/2010 | Nakamori et al. | 327/109 |
| 7,898,321 B2 | 3/2011 | Hayashi | |
| 7,988,354 B2* | 8/2011 | Jansen | 374/170 |
| 8,004,317 B2* | 8/2011 | Palmer et al. | 327/108 |
| 8,203,315 B2* | 6/2012 | Ladurner et al. | 320/150 |
| 2003/0026154 A1* | 2/2003 | Kang et al. | 365/211 |
| 2006/0186818 A1* | 8/2006 | Botti et al. | 315/94 |
| 2008/0094111 A1* | 4/2008 | Nakamori et al. | 327/108 |
| 2008/0297055 A1* | 12/2008 | Miyake et al. | 315/169.2 |
| 2009/0066404 A1* | 3/2009 | Heppenstall et al. | 327/513 |
| 2009/0128223 A1* | 5/2009 | Lui et al. | 327/513 |
| 2009/0184748 A1* | 7/2009 | Suzuki | 327/513 |
| 2009/0237126 A1 | 9/2009 | Chen | |
| 2010/0329304 A1* | 12/2010 | Doorenbos | 374/178 |
| 2011/0268151 A1* | 11/2011 | Hadwen et al. | 374/141 |
| 2012/0250385 A1* | 10/2012 | Takihara et al. | 363/132 |

* cited by examiner

ADAPTIVE GATE DRIVER STRENGTH CONTROL

RELATED APPLICATIONS

This application claims the benefit of U.S. Provisional Application No. 61/256,306 filed on Oct. 30, 2009, which is incorporated by reference herein.

TECHNICAL FIELD

This disclosure relates to the field of integrated circuits and, in particular, to an adaptive strength gate driver.

BACKGROUND

Semiconductor devices are electronic components used today in virtually all electronic devices and applications. One common semiconductor device is the metal-oxide-semiconductor field-effect transistor (MOSFET). In a MOSFET, a voltage applied to a gate terminal of the device can induce a conducting channel between two other terminals known as the source and drain. A MOSFET essentially functions as a switch which is opened (i.e., turned off) and closed (i.e., turned on) depending on a signal applied to the gate terminal of the device. The MOSFET structure causes the device to turn on/off at a faster rate when a higher voltage level is applied to the gate terminal.

The gate drive requirements for a MOSFET vary according to a number of factors. Process variations, temperature, load conditions, or other factors may all affect the speed at which the MOSFET turns on/off. For example, at cold temperatures, a MOSFET will be able to switch faster than it can at warmer temperatures. The faster switching at cold temperatures can cause problems such as overshoot and ringing in the drain source voltage ($V_{DS}$) of the MOSFET. Overshoot occurs when the voltage at the switched node exceeds the target voltage due to ringing, where the actual voltage oscillates above and below the target voltage before eventually settling at the target voltage. This effect is seen most often due to parasitic effects. Both effects are undesirable in electronic circuits. The effects of overshoot and ringing decrease at higher temperatures and at lower drive strength due to slower switching, however, the slower switching speeds lead to less efficiency.

The voltage signal applied to the gate terminal is typically generated by a gate driver circuit. Traditionally, the gate driver circuit was configured to apply a gate drive strength such that ringing does not cause voltage ratings of the MOSFET to be exceeded. For example, if the MOSFET is rated at 36 volts (V), and the supply voltage is 30V, then the gate driver circuit may only drive the MOSFET hard enough that 6V of ringing is seen, since any more will cause a voltage rating of the MOSFET to be exceeded. Since the gate drive strength is fixed, the same drive strength is used at higher temperatures even though the overshoot may be less. The drive strength may be set, for example, by using a fixed value resistor placed between an output of a gate driver and the gate terminal of the MOSFET. The lower drive strength to account for overshoot at cold temperatures leads to slower switching and the resulting inefficiency at the higher temperatures.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Embodiments of a method and apparatus are described to vary the strength of a gate driver signal to compensate for variations in gate charge of a transistor attributable to a change in temperature. Varying the strength of the gate driver signal based on temperature can maximize available efficiency in the system, minimize overshoot and undershoot excursions, and maximize the operating voltage range for the given voltage rating of the components involved. In one embodiment, a received temperature value representing the temperature at a gate terminal of the transistor is compared to one or more predefined voltage thresholds to determine an appropriate drive strength value. In another embodiment, the received temperature value is applied to a drive strength equation in order to calculate the drive strength value. The drive strength value represents a drive strength for a signal to drive the gate terminal of the transistor that will result in minimal overshoot and ringing. The drive strength value may be sent to a variable strength gate driver circuit which causes a signal with the appropriate drive strength to be applied to the gate terminal.

Figure 1:
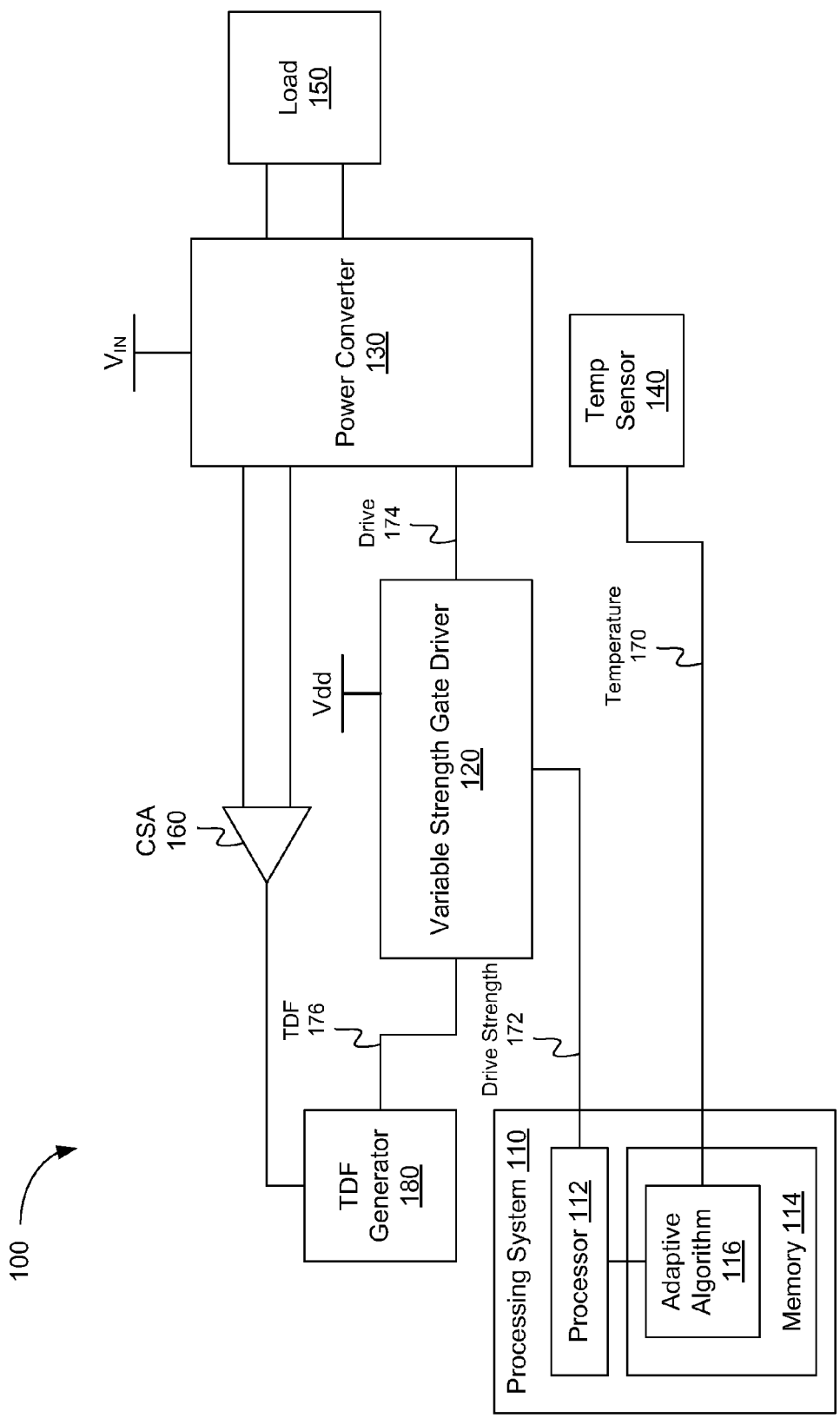
FIG. 1 is a block diagram illustrating an adaptive gate driver strength control system according to an embodiment.

FIG. 1 is a block diagram illustrating an adaptive gate driver strength control system according to an embodiment. In one embodiment, system 100 includes processing system 110, variable strength gate driver 120 and power converter 130. In one exemplary embodiment, processing system 110 may be a programmable System on a Chip (PSoC™) processing device, manufactured by Cypress Semiconductor Corporation, San Jose, Calif. Alternatively, processing system 110 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like. Additionally, the processing system 110 may include any combination of general-purpose processing devices and special-purpose processing devices.

Figure 2:
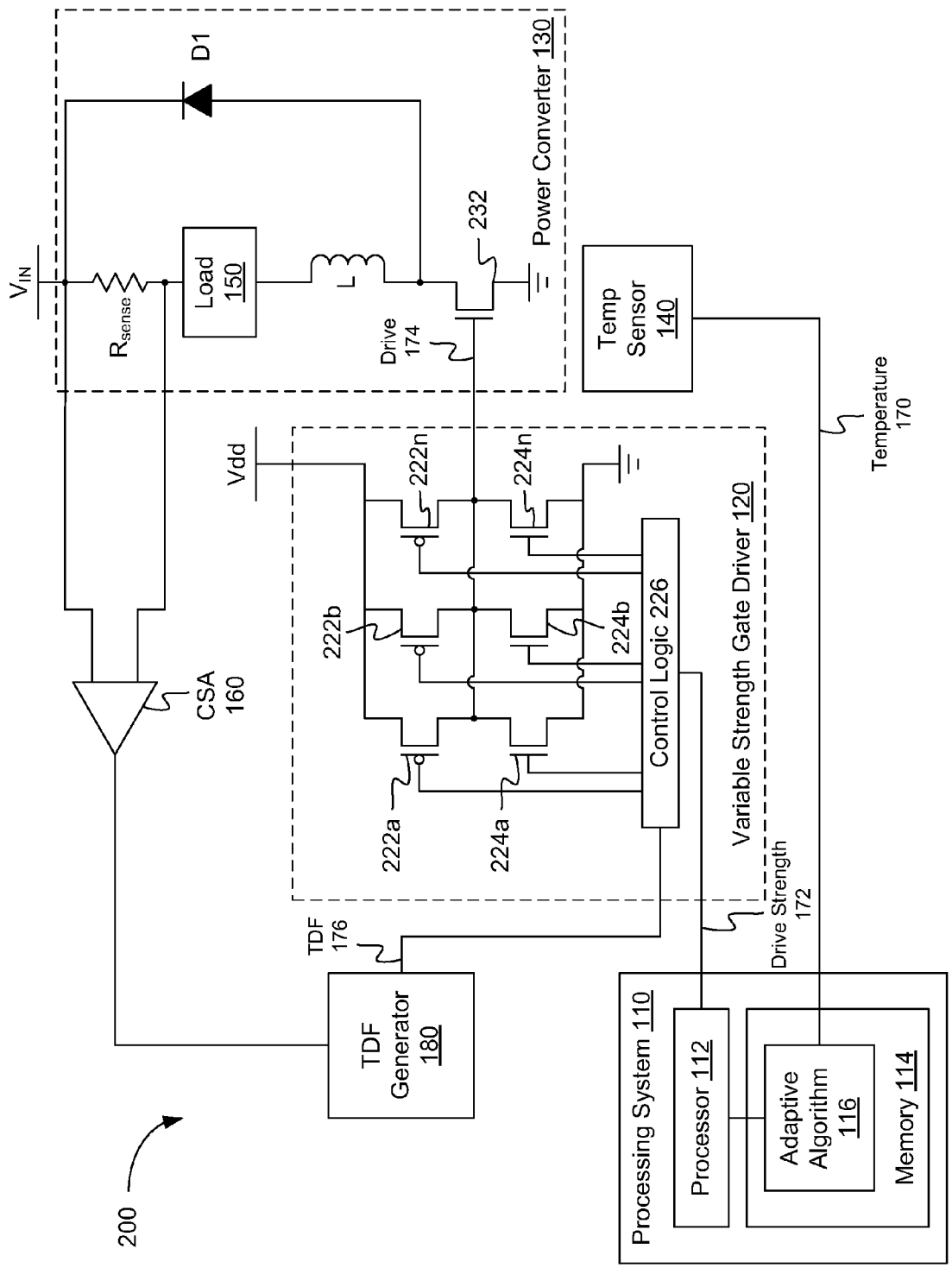
FIG. 2 is a circuit diagram illustrating an adaptive gate driver strength control system according to an embodiment.

As shown in FIG. 1, variable strength gate driver 120 and power converter 130 are external to processing system 110. In other embodiments, however, variable strength gate driver 120 and power converter 130 may be included on the same chip as processing system 110. In one embodiment, system 100 also includes temperature sensor 140. Temperature sensor 140 may be located near power converter 130 which includes transistor 232, as shown in FIG. 2. Temperature sensor 140 may be any type of known temperature sensor and may have an accuracy of approximately +/−3 degrees Celsius. In other embodiments, where power converter 130 and processing system 110 are fabricated on the same die, temperature sensor 140 may be implemented within processing system 110. Processing system 110 receives temperature signal 170 from temperature sensor 140. Temperature signal 170 may include a temperature value representing a temperature of transistor 232. A processor 112 in processing system 110 executes an adaptive algorithm 116 stored in a memory 114 to determine a drive strength value based on the received temperature value. Adaptive algorithm 116 will be described further below with respect to FIGS. 3A and 3B.

Variable strength gate driver 120 receives drive strength signal 172 from processing system 110. Drive strength signal 172 may include the drive strength value determined by adaptive algorithm 116. In response to the drive strength value in drive strength signal 172, variable strength gate driver 120 adjusts a drive signal 174 which is provided to the gate terminal of transistor 232 in power converter 130. In alternative embodiments, transistor 232 may be part of some circuit other than power converter 130. Drive signal 174 may be some portion of a supply voltage Vdd and adjusted by variable strength gate driver circuit 120 as described below with respect to FIG. 2. Power converter 130 may supply a voltage to a load 150. It will be appreciated that this methodology will be applicable to most MOSFET based power converter topologies and that this example is for illustration only.

In one embodiment, system 100 further includes current sense amplifier (CSA) 160 which measures a current flowing through power converter 130 and outputs a proportional voltage to temporal density function (TDF) generator 180. TDF generator 180 generates a TDF 176 which drives variable strength gate driver 120, causing variable strength gate driver 120 to charge and discharge the gate terminal of transistor 232 in accordance with the TDF 176. TDF generator 180 may be one of any known TDF generators or converter controllers, such as for example, a switch mode controller, a peak current controller, an average current controller, or other converter controller. In one embodiment TDF 176 may be a pulse width modulation (PWM) signal.

FIG. 2 is a circuit diagram illustrating an adaptive gate driver strength control system according to an embodiment. In one embodiment, system 200 includes processing system 110, variable strength gate driver 120 and power converter 130. Power converter 130 includes transistor 232. In one embodiment, transistor 232 is a metal-oxide-semiconductor field-effect transistor (MOSFET) having a gate terminal driven by variable strength gate driver 120. In other embodiments, transistor 232 may be some other type of transistor or semiconductor device. In one embodiment, power converter 130 further includes load 150 coupled between a resistor Rsense and an inductor L, all coupled in series to a drain terminal of transistor 232. A diode D1 is coupled in parallel with resistor Rsense, load 150 and inductor L. The source terminal of transistor 232 may be connected to ground. In this embodiment, CSA 160 measures the current through resister Rsense. This is merely one example of the structure of power converter 130 and in other embodiments, some other circuit structure may be used.

In one embodiment, variable strength gate driver 120 includes a first driver transistor array of one or more PMOS transistors and a second driver transistor array of one or more NMOS transistors arranged in one or more transistor pairs. Each transistor pair may include one PMOS transistor 222a-222n and one NMOS transistor 224a-224n. In this embodiment, each PMOS transistor 222a-222n is connected between a power supply Vdd and the gate terminal of transistor 232, and each NMOS transistor 224a-224n is connected between the gate terminal of transistor 232 and ground. In other embodiments, the position of PMOS and NMOS transistors may be reversed. The gate terminals of each of PMOS transistors 222a-222n and NMOS transistors 224a-224n receive a control signal from driver control logic block 226. The control signals either enable or disable each of transistors 222a-222n and 224a-224n in order to charge or discharge the gate terminal of transistor 232. Thus control logic 226 can modulate the drive strength by selecting a number of transistor array elements to be enabled at any given time.

Control logic 226 receives drive strength signal 172 from processing system 110 which may include the drive strength value determined by adaptive algorithm 116. Control logic 226 determines whether the drive strength value indicates that the drive strength at the gate terminal of transistor 232 needs to be increased or decreased. When TDF 176 indicates that the gate terminal of transistor 232 should be charged to Vdd, control logic 226 enables a certain number of PMOS transistors 222a-222n to allow the supply voltage Vdd to charge the gate terminal of transistor 232. The number of PMOS transistors 222a-222n enabled affects the speed at which the gate terminal of transistor 232 is charged. Thus, at higher temperatures, more PMOS transistors 222a-222n may be enabled because the transistor 232 responds slower and ringing is less of a problem. In addition, more PMOS transistors 222a-222n may be enabled since the ON resistance of each of the PMOS transistors is higher. Conversely, fewer PMOS transistors 222a-222n are enabled at lower temperatures. When TDF 176 indicates that the gate terminal of transistor 232 should be discharged, the appropriate number of NMOS transistors 224a-224n are enabled by control logic 226 to discharge the gate terminal. In this embodiment, three transistor pairs are shown in variable strength gate driver 120, corresponding to three steps in the drive strength. However, there may be any number of transistor pairs in other embodiments. The number of drive strength steps would be chosen to reflect the precision required in any given application.

Figure 3A:
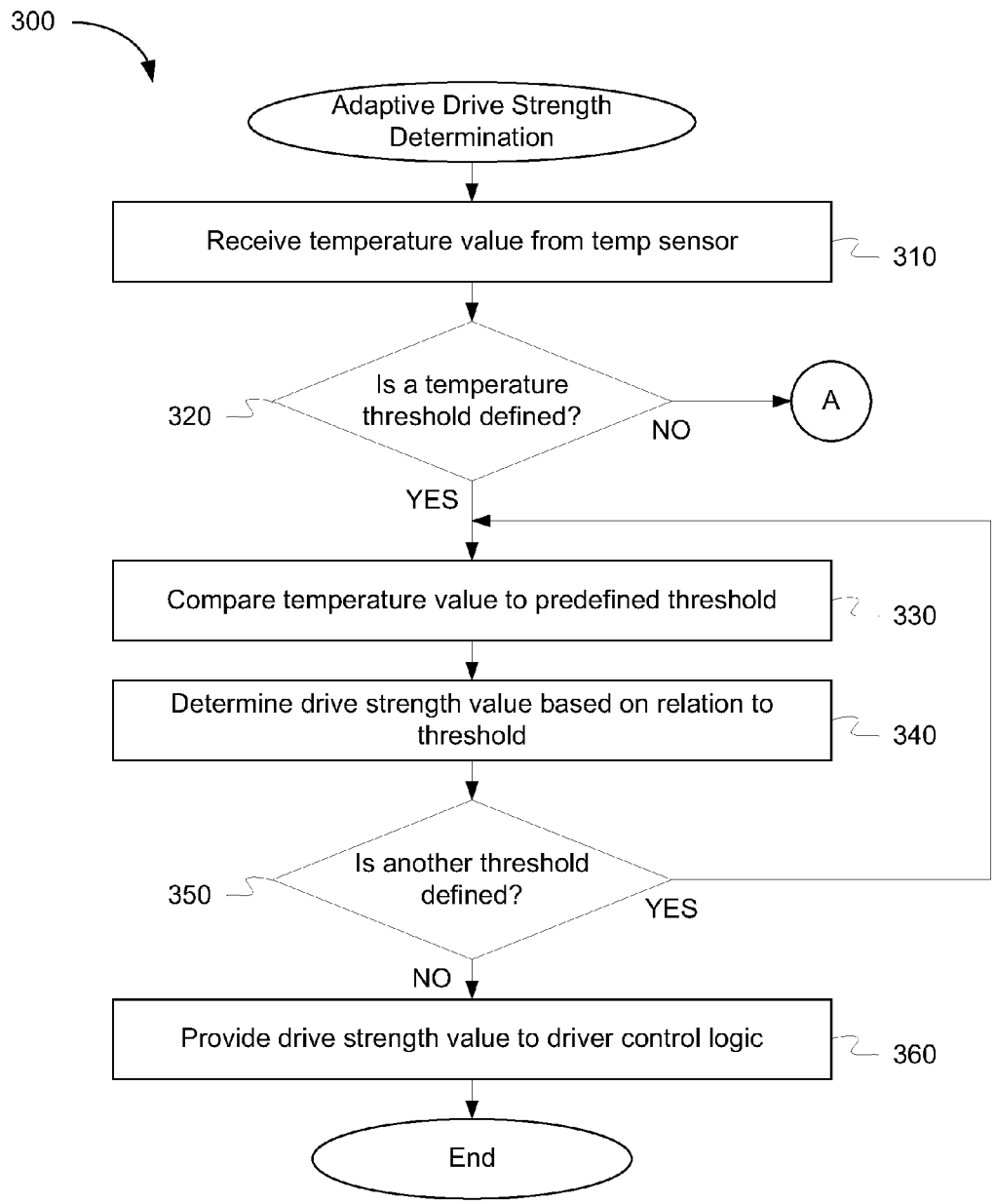
FIGS. 3A-3B are flow diagrams illustrating a method of adaptive gate drive strength determination according to an embodiment.
Figure 3B:
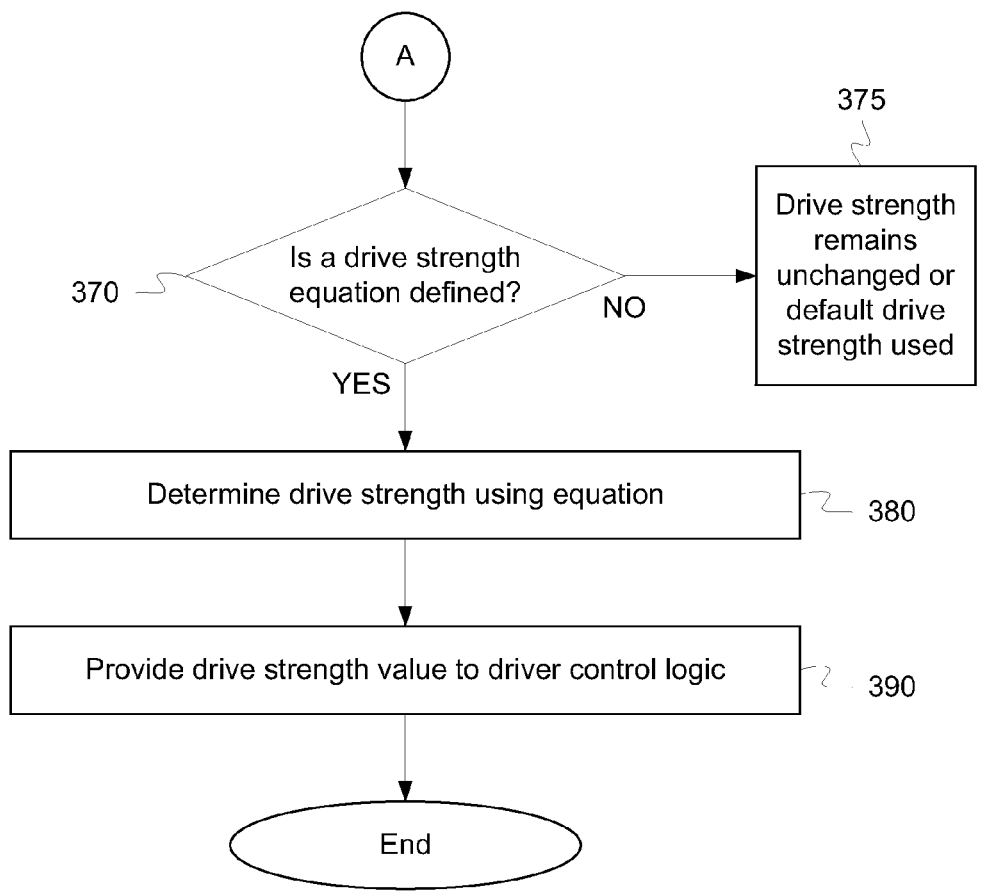

FIGS. 3A-3B are flow diagrams illustrating a method of adaptive gate drive strength determination according to an embodiment. The method 300 may be performed by processing logic (e.g., engines and modules) that may comprise hardware (e.g., circuitry, dedicated logic, programmable logic, microcode, etc.), software (such as instructions run on a processing device), firmware, or a combination thereof. In one embodiment, method 300 is performed by processor 112, which executes instructions from adaptive algorithm 116, as shown in FIGS. 1 and 2. The adaptive gate drive strength determination method 300 described herein may be used to determine a strength of a MOSFET gate driver to compensate for variations in gate charge of the MOSFET with temperature.

Referring to FIG. 3A, at block 310, method 300 receives a temperature signal from a temperature sensor, such as temperature sensor 140. The temperature signal may contain a temperature value representing a temperature at or near the gate terminal of a transistor, such as transistor 232. At block 320, method 300 determines whether a temperature threshold value has been defined. The temperature threshold value may be defined by either a user or a designer of the system and may be stored, for example in a register in processing system 110. The temperature threshold value may be a value representing a temperature that is a boundary between "hot" and "cold." For example, the temperature threshold value may represent a temperature of 50° C., where temperatures above 50° C. are considered "hot" and temperatures below 50° C. are considered "cold." The temperature threshold value may be used to determine how to adjust the drive strength if necessary.

If no temperature threshold value is defined, method 300 proceeds to block 370, which will be discussed further below. If at block 320, method 300 determines that a temperature threshold value is defined, method 300 proceeds to block 330. At block 330, method 300 compares the temperature value received at block 310 to the temperature threshold value. At block 340, method 300 determines a drive strength value based on the results of the comparison at block 330. For example, if the temperature value is greater than the temperature threshold value, a drive strength value corresponding to "hot" is determined. Conversely, if the temperature value is less than the temperature threshold value, a drive strength value corresponding to "cold" is determined.

At block 350, method 300 determines if another temperature threshold value is defined. If another temperature threshold value is defined, method 300 returns to block 330 and compares the temperature value to the second temperature threshold value. For example, a second temperature threshold value may be set at 60° C. If the temperature value is greater than 60° C., a greater drive strength value may be determined than if the temperature value is less than 60° C. It will be readily appreciated that the 60° C. value of temperature is purely for illustrative purposes and no limitation is implied with regards to either threshold. Method 300 may repeat the steps at blocks 330-350 any number of times up to the number of temperature threshold values that have been defined. In one embodiment, N temperature threshold values and N+1 drive strength values may be defined. One drive strength value may correspond to each temperature region set by the threshold values.

In one embodiment, processing system 110 may store previous temperature readings, the results of previous comparisons. and/or previous drive strength values in memory 114. In such an embodiment, method 300 may be configured with hysteresis. For example, a first temperature threshold value may be set at 55° C. A temperature value above 55° C. may result in a drive strength value corresponding to "hot." Furthermore, a second temperature threshold value may be set at 45° C., where a temperature value below 45° C. results in a drive strength value corresponding to "cold." For any temperature value that falls between 45° C. and 55° C., method 300 causes the drive strength value to remain unchanged from the previous value. This prevents excessive changes to the drive strength value when the temperature is fluctuating above and below one of the temperature threshold values. It will be appreciated that the 45° C. and 55° C. temperature thresholds are for illustrative purposes and any other numbers can be chosen by a person skilled in the art to suit the particular power converter at hand.

If at block 350, method 300 determines that no additional temperature threshold values have been defined, method 300 proceeds to block 360. At block 360, method 300 provides the determined drive strength value to the driver control logic 226 in variable strength gate driver 120. Driver control logic 226 causes the appropriate drive strength to be applied to the gate terminal of transistor 232, as described below with respect to FIG. 4.

Referring to FIG. 3B, at block 370, method 300 determines whether a drive strength equation has been defined. Rather than comparing the temperature value to one or more temperature thresholds, the temperature value may be applied to a drive strength equation to determine the drive strength. In one embodiment the drive strength equation may be a linear equation defined by the user or a system designer. The constant values in the equation may be determined through testing of the transistor 232 at various temperature values. If at block 370, method 300 determines that a drive strength equation has been defined, method 300 proceeds to block 380. At block 380 method 300 applies the temperature value to the drive strength equation and determines the resulting drive strength value. At block 390, method 300 provides the drive strength value to the driver control logic 226 in variable strength gate driver 120.

If at block 370, method 300 determines that a drive strength equation has not been defined, method 300 proceeds to block 375. At block 375, method 300 may cause the drive strength value to remain unchanged from the previous value or may use a default drive strength value defined by the user or designer.

Figure 4:
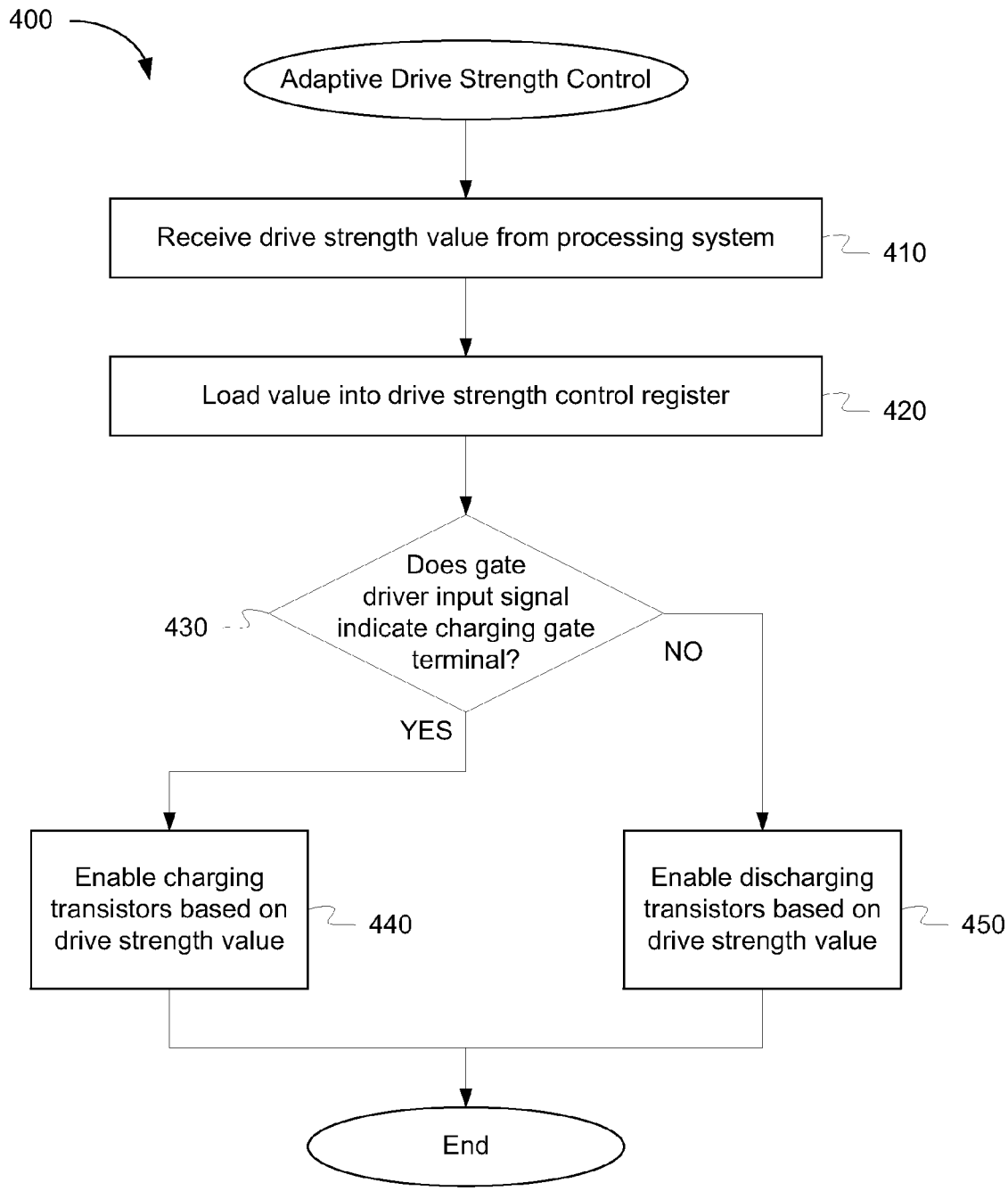
FIG. 4 is a flow diagram illustrating a method of adaptive drive strength control according to an embodiment.

FIG. 4 is a flow diagram illustrating a method of adaptive drive strength control according to an embodiment. The method 400 may be performed by processing logic (e.g., engines and modules) that may comprise hardware (e.g., circuitry, dedicated logic, programmable logic, microcode, etc.), software (such as instructions run on a processing device), firmware, or a combination thereof. In one embodiment, method 400 is performed by control logic 226, as shown in FIG. 2. The adaptive drive strength control method 400 described herein may be used to vary the strength of a MOSFET gate driver to compensate for variations in gate charge of the MOSFET with temperature.

Referring to FIG. 4, at block 410, method 400 receives drive strength signal 172 from processing system 110. Drive strength signal 172 may include a drive strength value determined by method 300 as described above with respect to FIGS. 3A and 3B. In one embodiment, the drive strength value may be a 4 bit value corresponding to the desired drive strength. At block 420, method 400 loads the received drive strength value into a drive strength control register in control logic 226.

At block 430, method 400 determines if the gate driver input signal indicates that the gate terminal of transistor 232 should be charged. In one embodiment, gate driver input signal is TDF 176. In one embodiment where TDF generator 180 is a switch mode controller, TDF 176 causes variable strength gate driver 120 to alternately charge and discharge the gate terminal of transistor 232. If at block 430, method 400 determines that the driver input signal indicates charge of the gate terminal, method 400 proceeds to block 440. At block 440, method 400 enables a number of charging transistors, such as PMOS transistors 222a-222n, based on the drive strength value received at block 410 and stored in the register at block 420. In one embodiment, the drive strength value may correspond to a percentage of the total available drive strength. For example, control logic 226 may be programmed to enable a set number of PMOS transistors 222a-222n for a given drive strength value. This relationship between the percentage of drive strength and the drive strength value may be defined by the user or by the system designer. At higher temperatures, the response of transistor 232 will be slower, thus allowing a higher drive strength to be used without incurring the negative effects of overshoot and ringing. Thus, in general, at higher temperatures, more of transistors 222a-222n are enabled, causing the drive strength to increase and the gate terminal of transistor 232 to be charged to Vdd faster. At lower temperatures, fewer of transistors 222a-222n are enabled, because the transistors 232 will switch faster and be more susceptible to overshoot and ringing. It will also be apparent that there is no necessary linkage between the number of PMOS and NMOS transistor elements switched.

If at block 430, method 400 determines that the gate driver input signal does not indicate charging the gate terminal of transistor 232, method 400 proceeds to block 450. At block 450, method 400 enables a number of discharging transistors, such as NMOS transistors 224a-224n based on the drive strength value received at block 410 and stored in the register at block 420. The number of discharging capacitors enabled is chosen in a similar manner to the number of charging capacitors enabled, as described above. In certain embodiments, the number of charging capacitors and discharging capacitors enabled may be the same for a given drive strength value, however, in other embodiments, the numbers may be independent. The gate terminal of transistor 232 is thus driven with an adaptive gate driver signal which compensates for temperature variations.

Embodiments of the present invention include various operations described herein. These operations may be performed by hardware components, software, firmware, or a combination thereof. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable storage medium. These instructions may be used to program a general-purpose or special-purpose processor to perform the described operations. A machine-readable medium includes any mechanism for storing information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

What is claimed is:

1. A method, comprising:
   receiving, at a processing system, a temperature value that represents a temperature at a gate terminal of a first transistor;
   determining, by a processor of the processing system, a drive strength value based on the temperature value, wherein the drive strength value comprises a digital value indicating a drive strength for a drive signal to be applied to the gate terminal of the first transistor, wherein the drive strength for the drive signal is directly proportional to the temperature;
   adjusting the drive strength of the drive signal, by a variable strength gate driver circuit coupled to the processing system and the first transistor, based on the determined drive strength value, wherein adjusting the drive strength of the drive signal comprises selecting one or more second transistors, which is different from the first transistor, in the variable strength gate driver circuit to at least one of charge or discharge the gate terminal of the first transistor, wherein the selected one or more second transistors control a speed at which the gate terminal of the first transistor is charged or discharged; and
   applying the drive signal with the adjusted drive strength to the gate terminal of the first transistor.

2. The method of claim 1, further comprising:
   determining whether a temperature threshold value has been defined.

3. The method of claim 2, wherein when the temperature threshold value is defined, determining the drive strength value comprises comparing the temperature value to a first predefined temperature threshold value and determining the drive strength value based on the comparison.

4. The method of claim 3, wherein determining the drive strength value further comprises comparing the temperature value to a second predefined temperature threshold value and determining the drive strength value based on the comparison.

5. The method of claim 1, wherein, when a temperature threshold value is not defined, determining the drive strength value comprises calculating the drive strength value with a drive strength equation using the temperature value for a variable in the drive strength equation.

6. The method of claim 1, further comprising:
   providing the drive strength value to a driver control logic block of a variable strength gate driver circuit.

7. The apparatus of claim 1, wherein the drive strength of the drive signal increases when the temperature increases, and the drive strength of the drive signal decreases when the temperature decreases.

8. A system, comprising:
   a first transistor comprising a gate terminal;
   a processing system comprising a processor unit, wherein the processing system comprises a machine readable storage medium storing instructions which, when executed by the processor unit, cause the processing system to:
     receive a temperature value that represents a temperature at the gate terminal of the first transistor, and
     determine a drive strength value that represents a drive strength for the signal based on the temperature value, wherein the drive strength value comprises a digital value indicating a drive strength for a drive signal to be applied to the gate terminal of the first transistor, wherein the drive strength for the drive signal is directly proportional to the temperature; and
   a variable strength gate driver circuit coupled to the processing system and the first transistor and configured to supply a drive signal to the gate terminal of the first transistor, the signal to control a speed at which the gate terminal of the first transistor is charged or discharged, the variable strength gate driver circuit is further configured to:
     receive the determined drive strength value from the processing system,
     adjust the drive strength value of the drive signal based on the determined drive strength value, wherein adjusting the drive strength of the drive signal comprises selecting one or more second transistors, which is different from the first transistor, in the variable strength gate driver circuit to at least one of charge or discharge the gate terminal of the first transistor, wherein the selected one or more second transistors control a speed at which the gate terminal of the first transistor is charged or discharged, and apply the drive signal with the adjusted drive strength to the gate terminal of the first transistor.

9. The system of claim 8, wherein the instructions further cause the processing system to:
determine whether a temperature threshold value has been defined.

10. The system of claim 9, wherein when the temperature threshold value is defined, the instructions further cause the processing system to: compare the temperature value to a first predefined temperature threshold value.

11. The system of claim 10, wherein the instructions further cause the processing system to:
compare the temperature value to a second predefined temperature threshold value.

12. The system of claim 8, wherein when a temperature threshold value is not defined, the instructions further cause the processing system to:
apply the temperature value to calculate a drive strength equation using the temperature value for a variable.

13. The system of claim 12, wherein when the drive strength equation is not used, the drive strength value represents no change in the drive strength of the signal.

14. The system of claim 8, wherein the variable strength gate driver circuit comprises:
a first driver transistor array comprising an array of N-type metal-oxide-semiconductor field-effect (NMOS) transistors;
a second driver transistor array comprising an array of P-type metal-oxide-semiconductor field-effect (PMOS) transistors; and
a driver control logic block configured to receive the drive strength value from the processing system and modulate the drive strength based on the drive strength value by selecting the one or more NMOS or PMOS transistor from one of the first driver transistor array or the second driver transistor array to charge or discharge the gate terminal of the first transistor.

15. The system of claim 14, wherein the driver control logic block is further configured to:
activate at least a first PMOS transistor of the PMOS transistor array if the received drive strength value indicates that the drive strength is increased; and
activate at least a first NMOS transistor of the NMOS transistor array if the drive strength value indicates that the drive strength is decreased.

16. The system of claim 8, wherein the drive strength of the drive signal increases when the temperature increases, and the drive strength of the signal decreases when the temperature decreases.

17. An apparatus comprising:
a temperature sensor configured to measure a temperature at a gate terminal of a first transistor, the temperature sensor to indicate the temperature with a temperature value;
a processing system coupled to the temperature sensor, the processing system configured to compare the temperature value to a temperature threshold and determine a drive strength value based on the comparison, wherein the drive strength value comprises a digital value indicating a drive strength for a drive signal to be applied to the gate terminal of the first transistor, wherein the drive strength for the drive signal is directly proportional to the temperature; and
a variable strength gate driver circuit coupled to the processing system and the first transistor, the variable strength gate driver circuit configured to adjust the drive strength of the drive signal based on the determined drive strength value, wherein adjusting the drive strength of the drive signal comprises selecting one or more second transistors, which is different from the first transistor, in the variable strength gate driver circuit to at least one of charge or discharge the gate terminal of the first transistor, wherein the selected one or more second transistors control a speed at which the gate terminal of the first transistor is charged or discharged, and wherein the variable strength gate driver circuit is further configured to apply the drive signal with the adjusted drive strength to the gate terminal of the first transistor.

18. The apparatus of claim 17, wherein the variable strength gate driver circuit comprises a control logic circuit, and wherein a first driver transistor array comprises one of an array of N-type metal-oxide-semiconductor field-effect (NMOS) transistors or an array of P-type metal-oxide-semiconductor field-effect (PMOS) transistors, the control logic circuit to enable the one or more NMOS or PMOS transistor in the first driver transistor array to modulate the drive signal with the determined drive strength value.

19. The apparatus of claim 17, wherein the drive signal with the determined drive strength value is applied to a third transistor in a power converter circuit.

20. The apparatus of claim 17, wherein the drive strength of the drive signal increases when the temperature value increases, and the drive strength of the drive signal decreases when the temperature value decreases.

\* \* \* \* \*